(12) United States Patent
Kim et al.

(10) Patent No.: US 10,504,392 B2
(45) Date of Patent: Dec. 10, 2019

(54) DISPLAY APPARATUS AND METHOD OF MANUFACTURING THE SAME

(71) Applicant: Samsung Display Co., Ltd., Yongin-si, Gyeonggi-Do (KR)

(72) Inventors: Jang-Hyun Kim, Hwaseong-si (KR); Minsu Kim, Seoul (KR); Jin-Lak Kim, Suwon-si (KR); Dongsoup Noh, Hwaseong-si (KR); Sehee Han, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 178 days.

(21) Appl. No.: 15/682,613

(22) Filed: Aug. 22, 2017

(65) Prior Publication Data

US 2018/0068598 A1   Mar. 8, 2018

(30) Foreign Application Priority Data

Sep. 6, 2016  (KR) .......................... 10-2016-0114569

(51) Int. Cl.
*G09C 3/00* (2006.01)
*H01L 27/12* (2006.01)
*H01L 51/52* (2006.01)
*H01L 51/00* (2006.01)
*G09G 3/00* (2006.01)

(52) U.S. Cl.
CPC .......... *G09G 3/002* (2013.01); *H01L 27/1203* (2013.01); *H01L 51/5253* (2013.01); *H01L 51/0097* (2013.01); *H01L 2251/301* (2013.01)

(58) Field of Classification Search
CPC .. G09G 3/002; H01L 27/1203; H01L 51/5253
See application file for complete search history.

(56) References Cited

U.S. PATENT DOCUMENTS

2005/0140858 A1* 6/2005 Park .................... G02F 1/13394
349/110
2008/0204636 A1* 8/2008 Ge .................... G02F 1/133345
349/114

(Continued)

FOREIGN PATENT DOCUMENTS

KR    1020140080139 A    6/2014
KR    1020140085956 A    7/2014

(Continued)

*Primary Examiner* — Ariel A Balaoing
(74) *Attorney, Agent, or Firm* — Cantor Colburn LLP (57) ABSTRACT

A display apparatus includes a lower substrate, an upper substrate facing the lower substrate, an optical medium layer between the lower and upper substrates, a display area at which an image is displayed, and a peripheral area adjacent to the display area and at which the image is not displayed. The lower substrate includes a flexible film on a lower base substrate and including a flat portion in the display and peripheral area, and the flat portion extending from the peripheral area and along a side surface of the lower base substrate to define a bent portion in the peripheral area, a thin film transistor on the flexible film in the display area, a connecting line on the flexible film in the peripheral area and electrically connected to the thin film transistor, and a wire grid polarizer between the flexible film and the optical medium layer in the display area.

20 Claims, 8 Drawing Sheets

(56) References Cited

U.S. PATENT DOCUMENTS

| | | | |
|---|---|---|---|
| 2012/0075699 A1* | 3/2012 | Davis | C23C 14/04 359/492.01 |
| 2013/0308071 A1* | 11/2013 | Kim | H01L 33/08 349/43 |
| 2014/0002385 A1* | 1/2014 | Ka | G06F 1/1601 345/173 |
| 2014/0055702 A1* | 2/2014 | Park | G02F 1/136286 349/43 |
| 2014/0183473 A1* | 7/2014 | Lee | H01L 51/0097 257/40 |
| 2015/0102298 A1* | 4/2015 | Namkung | H01L 51/0097 257/40 |
| 2017/0102569 A1 | 4/2017 | Kim et al. | |

FOREIGN PATENT DOCUMENTS

| | | |
|---|---|---|
| KR | 1020160053073 A | 5/2016 |
| KR | 1020170043135 A | 4/2017 |

\* cited by examiner

DISPLAY APPARATUS AND METHOD OF MANUFACTURING THE SAME

This application claims priority to Korean Patent Application No. 10-2016-0114569, filed on Sep. 6, 2016, and all the benefits accruing therefrom under 35 U.S.C. § 119, the content of which in its entirety is herein incorporated by reference.

BACKGROUND

1. Field

Exemplary embodiments of the invention relate to a display apparatus and a method of manufacturing the display apparatus. More particularly, exemplary embodiments of the invention relate to a display apparatus for which a bezel width thereof is decreased and a display quality thereof is improved, and a method of manufacturing the display apparatus.

2. Description of the Related Art

A display apparatus having relatively light weight and small size has been manufactured. A cathode ray tube ("CRT") display apparatus has been used due to a performance and a competitive price. However the CRT display apparatus has a weakness with a size or portability thereof. Therefore a display apparatus such as a plasma display apparatus, a liquid crystal display apparatus and an organic light emitting display apparatus has been highly regarded due to a relatively small size, light weight and low-power-consumption thereof.

The liquid crystal display apparatus applies a voltage to a specific molecular arrangement to change the molecular arrangement and display an image. The liquid crystal display apparatus displays an image using changes of an optical property (for example, birefringence, rotatory polarization, dichroism and light scattering) of a liquid crystal display cell according to the changes of the molecular arrangement of the liquid crystal molecules therein.

SUMMARY

One or more exemplary embodiment of the invention provides a display apparatus for which a peripheral area as a non-display area thereof is decreased and a display quality thereof is improved.

One or more exemplary embodiment of the invention also provides a method of manufacturing the display apparatus.

According to an exemplary embodiment of the invention, a display apparatus includes a lower substrate, an upper substrate facing the lower substrate, an optical medium layer disposed between the lower substrate and the upper substrate, a display area at which an image is displayed with light and a peripheral area adjacent to the display area and at which the image is not displayed. The lower substrate includes a lower base substrate, a flexible film disposed on the lower base substrate and including a flat portion thereof in the display area and in the peripheral area, and the flat portion extending from the peripheral area and along a side surface of the lower base substrate to define a bent portion of the flexible film in the peripheral area, a thin film transistor disposed on the flexible film in the display area, a connecting line disposed on the flexible film in the peripheral area and electrically connected to the thin film transistor, and a wire grid polarizer disposed between the flexible film and the liquid crystal layer in the display area.

In an exemplary embodiment, the flexible film may include at least one selected from among polyimide, polyethylene terephthalate, polycarbonate, polyethylene naphthalate and polyacrylate.

In an exemplary embodiment, the flexible film may have a thickness greater than or equal to about 1 micrometer (μm).

In an exemplary embodiment, the display apparatus may further include a first insulation layer which is disposed on the flexible film and includes an inorganic insulation material.

In an exemplary embodiment, the display apparatus may further include a gate pattern disposed on the flexible film in the display area, and a data pattern disposed on the gate pattern. The connecting line in the peripheral area may be formed from a same material layer as the gate pattern or data pattern in the display area.

In an exemplary embodiment, the display apparatus may further include a protecting layer disposed on the connecting line in the peripheral area.

In an exemplary embodiment, the display apparatus may further include a second insulation layer disposed between the gate pattern and the data pattern, and a third insulation layer disposed on the data pattern. The protecting layer in the peripheral area may be formed from a same material layer as the second or third insulation layer in the display area.

In an exemplary embodiment, the wire grid polarizer may have a pitch of bout 50 nanometers (nm) to about 150 nm.

In an exemplary embodiment, the display apparatus may further include a capping layer on the wire grid polarizer.

In an exemplary embodiment, the display apparatus may further include a driving part which generates and provides signals for driving the display area, the driving part disposed at a distal end of the bend portion of the flexible film and electrically connected to the connecting line in the peripheral area.

According to an exemplary embodiment of the invention, a method of manufacturing a display apparatus includes forming a lower display substrate, including forming a flexible film on a lower base substrate in a display area at which an image is displayed with light, the flexible film in the display area extended to a peripheral area which is adjacent to the display area and at which the image is not displayed, forming a wire grid polarizer on the flexible film in the display area, forming a thin film transistor on the wire grid polarizer in the display area, and forming a connecting line on the flexible film in the peripheral area and electrically connected to the thin film transistor in the display area, forming an upper display substrate to face the lower display substrate, disposing a sealing member and an optical medium layer between the lower substrate and an upper substrate, separating a portion of the lower base substrate in the peripheral area from a portion of the flexible film in the peripheral area to expose an outer side surface of the lower base substrate; and bending the flexible film and the connection line in the peripheral area along the exposed outer side surface of the lower base substrate to form the display apparatus.

In an exemplary embodiment, the separating of the portion of the lower base substrate may further include irradiating a laser beam to the portion of the flexible film in the peripheral area and removing the portion of the lower base substrate from a remainder of the lower base substrate.

In an exemplary embodiment, the forming of the flexible film may include coating at least one among polyimide, polyethylene terephthalate, polycarbonate, polyethylene naphthalate and polyacrylate on the lower base substrate.

In an exemplary embodiment, the flexible film may have a thickness greater than or equal to about 1 μm.

In an exemplary embodiment, the method may further include forming a first insulation layer including an inorganic insulation layer, on the flexible film, before the forming of the wire grid polarizer.

In an exemplary embodiment, the method may further include forming a gate pattern on the flexible film, and forming a data pattern on the gate pattern. The connecting line in the peripheral area may be formed from a same material layer as the gate pattern or data pattern in the display area.

In an exemplary embodiment, the method may further include forming a protecting layer on the connecting line in the peripheral area.

In an exemplary embodiment, the method may further include forming a second insulation layer on the gate pattern, and forming a third insulation layer on the data pattern. The protecting layer in the peripheral area may be formed from a same material layer as the second or third insulation layer in the display area.

In an exemplary embodiment, the wire grid polarizer may have a pitch of about 50 nm to about 150 nm.

In an exemplary embodiment, the method may further include forming a capping layer on the wire grid polarizer.

According to one or more exemplary embodiment of the invention, a display apparatus includes a flexible film including a flat portion and a bent portion which is bent along a side surface of a lower base substrate, and a wire grid polarizer disposed between an optical medium layer such as a liquid crystal layer and the flexible film. The flat portion of the flexible film is disposed on the lower base substrate in both a display area and in a peripheral area and extends from the peripheral area to be outside of the lower base substrate. The bent portion of the flexible film and the connecting line are both extensions of flat portions thereof located at the peripheral area and are bent along the side surface of the lower base substrate in the peripheral area. Accordingly, since lengths of layers such as the flexible film and connecting line area disposed in a thickness direction of the display apparatus, the lengths do not add to a planar dimension of the peripheral area. Since the planar dimension of the peripheral area is reduced, a size of the bezel such as a width thereof as a non-display area of the display apparatus may be reduced.

In addition, within a display panel of the display apparatus, the flexible film may have sufficient cross-sectional thickness in a flat state thereof so as to not be damaged even though the flexible film is bent. Here, the wire grid polarizer is disposed between the flexible film and the optical medium layer, so that light from a light source disposed outside the display panel may be polarized by passing the wire grid polarizer after passing through the flexible film. Thus, distortion of a displayed image due to retardation can be minimized.

It is to be understood that both the foregoing general description and the following detailed description are exemplary and explanatory and are intended to provide further explanation of the invention as claimed

BRIEF DESCRIPTION OF THE DRAWINGS

The above and other features of the invention will become more apparent by describing in detail exemplary embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In describing relationships between elements such as being "on," "connected to," "between," etc., it will be understood that an element can be directly related to another element or intervening elements may be present therebetween. In contrast, when an element is referred to as being "directly" related to another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

A display apparatus includes a display area in which an image is displayed and a peripheral area (e.g., a bezel area) which is a non-display area in which the image is not displayed. A circuit pattern for driving the display apparatus is disposed in the peripheral area of the display apparatus and may restrict decreasing of the bezel area thereof. Therefore, reducing a width of the peripheral area has been studied to decrease a size of the bezel area and maximize a size of the display area.

Figure 1:
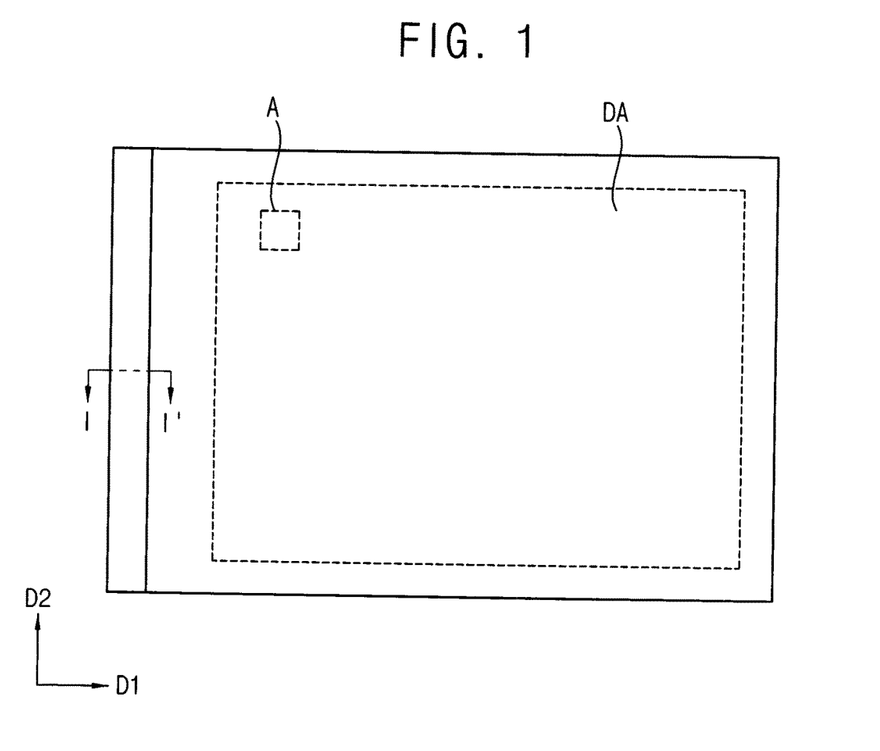
FIG. 1 is a top plan view illustrating an exemplary embodiment of a display apparatus according to the invention.
Figure 2:
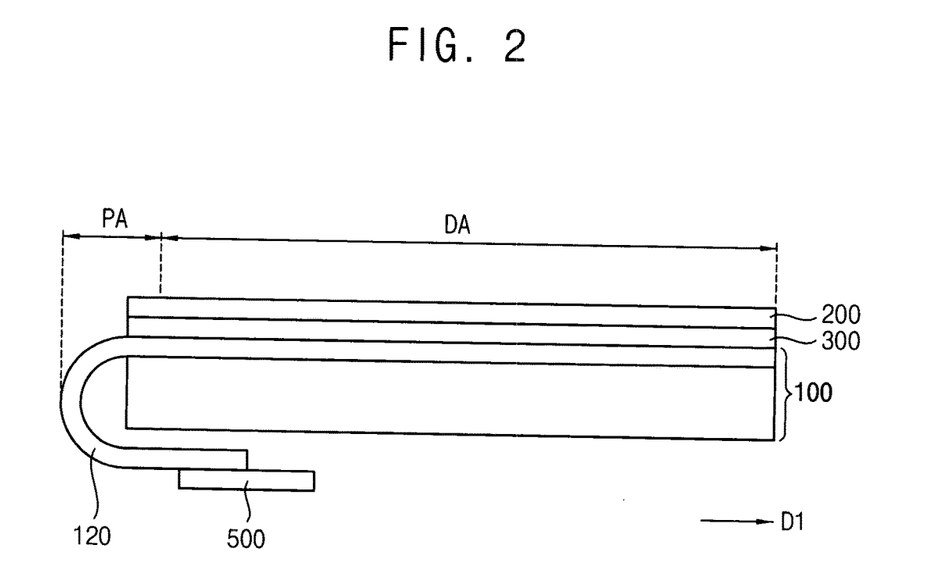
FIG. 2 is an exemplary embodiment of a side cross-sectional view of the display apparatus of FIG. 1.
Figure 3:
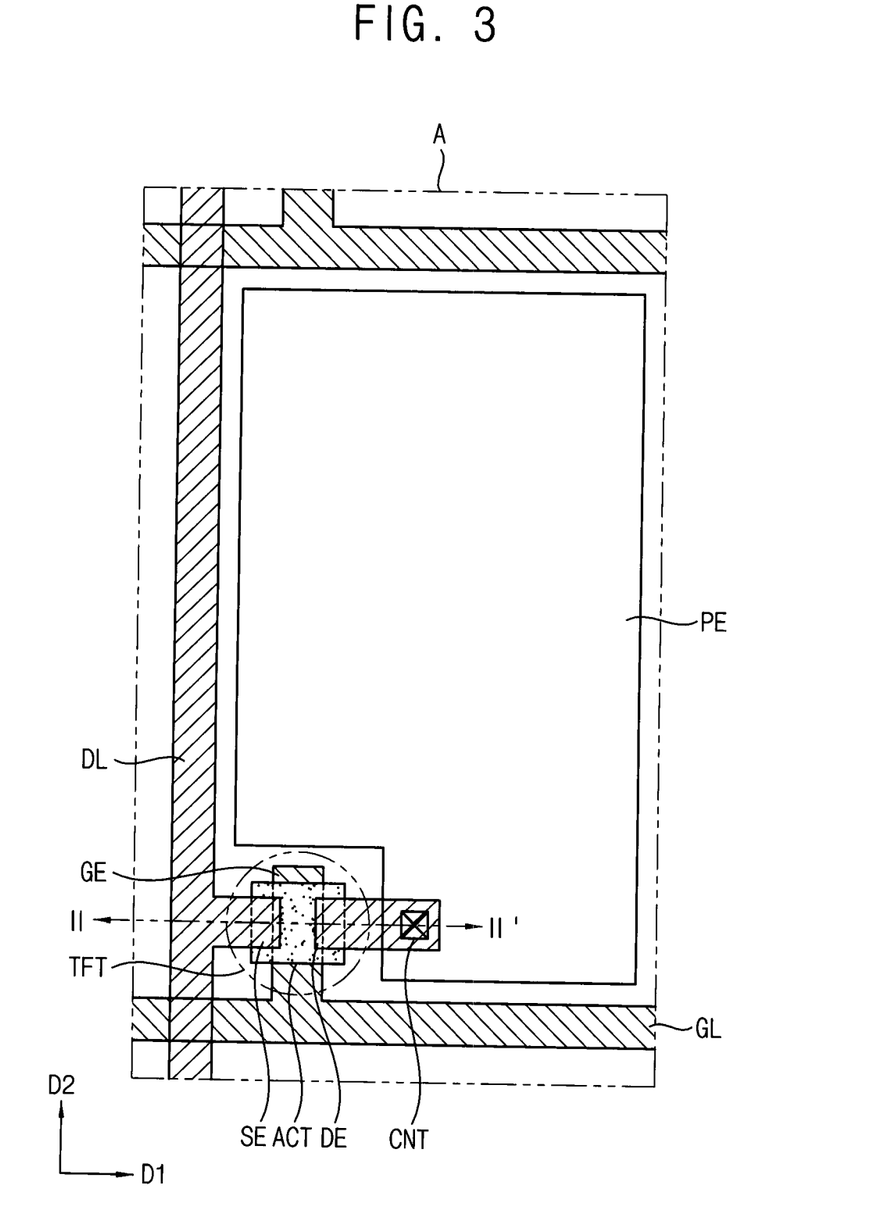
FIG. 3 is an enlarged top plan view illustrating an exemplary embodiment of area A of the display apparatus of FIG. 1.
Figure 4:
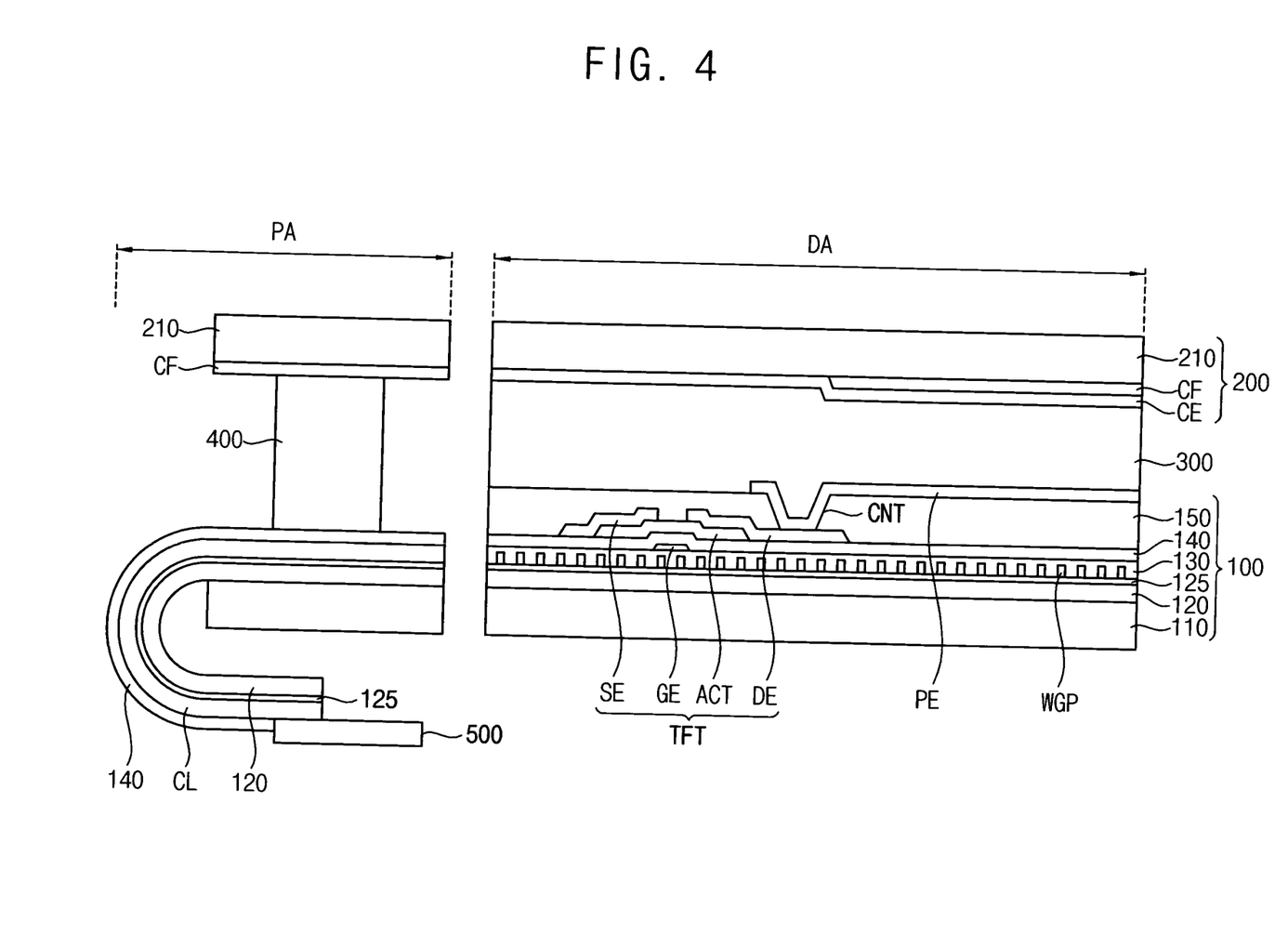
FIG. 4 is an enlarged cross-sectional view of the display apparatus taken along line I-I' of FIG. 1 and line II-II' of FIG. 3.

FIG. 1 is a top plan view illustrating an exemplary embodiment of a display apparatus according to the invention. FIG. 2 is an exemplary embodiment of a side cross-sectional view of the display apparatus of FIG. 1. FIG. 3 is an enlarged top plan view illustrating an exemplary embodiment of area A of the display apparatus of FIG. 1. FIG. 4 is an enlarged cross-sectional view of the display apparatus taken along line I-I' of FIG. 1 and line II-II' of FIG. 3.

Referring to FIGS. 1 to 4, a display apparatus includes a display panel which generates an image with light and displays the image. A light source generates the light which is used by the display panel to generate and display the image. The light source may be included in a backlight unit of the display apparatus which is separate from the display panel thereof and provides the light to the display panel. In an exemplary embodiment, a backlight unit (not shown) may be provided under the display panel such that light passes through layers of the display panel to be emitted therefrom as a displayed image.

The display panel may collectively include a lower (display) substrate 100, an upper (display) substrate 200, an optical medium layer 300 such as a liquid crystal layer 300, and a sealing member 400. The display panel may be divided into a display area DA and a peripheral area PA which surrounds the display area DA. In the top plan view, a total planar area of the display panel may be defined by the display area DA and the peripheral area PA.

An image may be generated and displayed in the display area DA. A pixel is disposed in the display area DA. The image may be generated and/or displayed at the pixel. A pixel may correspond to the area A shown in FIG. 1. The pixel may be provided in plurality within the display area DA.

The peripheral area PA is a non-display area at which the image is not displayed. The peripheral area PA may be disposed adjacent to the display area DA in a first direction D1. The peripheral area PA may be disposed at an outer edge portion of the lower substrate 100.

The lower substrate 100 may include a lower base substrate 110, a flexible film 120, a first insulation layer 125, a wire grid polarizer WGP, a capping layer 130, a gate pattern, a second insulation layer 140, an active pattern ACT, a data pattern, a third insulation layer 150 and a pixel electrode PE.

The lower base substrate 110 may include a material which has relatively high transmittance, thermal resistance and chemical resistance. In an exemplary embodiment, for example, the lower base substrate 110 may include a glass substrate, a quartz substrate, a transparent resin substrate, etc. The transparent resin substrate for the lower base substrate 110 may include polyimide-based resin, acryl-based resin, polyacrylate-based resin, polycarbonate-based resin, polyether-based resin, sulfonic acid containing resin, polyethyleneterephthalate-based resin, etc.

The flexible film 120 may be disposed on the lower base substrate 110. The flexible film 120 may include a flat portion on the lower base substrate 110 and a bent portion extending from the flat portion toward an outer edge of the lower base substrate 110. The flat portion may be disposed on entire of the lower base substrate 110, and the bent portion may be disposed bent along a side surface of the lower base substrate 110 at the outer edge thereof. Thus, the flat portion of the flexible film 120 may be disposed on the lower base substrate 110 in the display area DA and the peripheral area PA The bent portion may extend from the lower base substrate 110 be disposed bent along the side surface of the lower base substrate 110 in the peripheral area PA and disposed at a rear of the lower base substrate 110. While shown separated in FIG. 4, the flexible film 120 of the display area DA is extended to the peripheral area PA to be commonly disposed in the peripheral area PA at positions above, under and at the side of the lower base substrate 110.

In a thickness direction of the display panel and/or the display apparatus (e.g., vertical direction in FIGS. 2 and 4), the flexible film 120 may have sufficient cross-sectional thickness, so that flexible film 120 may not be damaged although being bent. In an exemplary embodiment, for example, the flexible film 120 may have a thickness of about 1 micrometer (um) or more. Referring to FIG. 4, the thickness may be a maximum dimension of the flexible film 120 taken in a normal direction (e.g., perpendicular) to the lower base substrate 110.

According to the exemplary embodiment, the wire grid polarizer WGP may be disposed between the flexible film 120 and the liquid crystal layer 300. Light generated from a light source may be incident to the display panel such as at the lower base substrate 110, pass through the flexible film 120 to reach the wire grid polarizer WGP, and then be polarized by passing through the wire grid polarizer WGP, so that distortion of an image may be reduced.

Furthermore, a thickness of the flexible film 120 can be determined according to material of the flexible film 120. In addition, the flat portion of the flexible film 120 is formed at an entirety of the lower base substrate 110, so that a stepped portion between the display area DA and the peripheral area PA is not formed. Thus, breakage of a connecting line CL on the flexible film 120 may be reduced or effectively prevented.

The flexible film 120 may include or be formed of flexible material. In an exemplary embodiment, for example, the flexible film 120 may include polyimide, polyethylene terephthalate, polycarbonate, polyethylene naphthalate and/or polyacrylate. The flexible film 120 may include a material and/or have a thickness which allows light to pass therethrough, such as to the wire grid polarizer WGP.

In addition, the flexible film 120 may have a heat resistance greater than about 300 degrees Celsius. Accordingly, in a method of manufacturing a display apparatus, the flexible film 120 may not be damaged although a relatively high-temperature manufacturing process such as a laser beam irradiation process is performed.

Here, the connecting line CL which will be mentioned later may be bent along the side surface of the lower base substrate 110 along with the bent portion of the flexible film 120. Accordingly, a bezel which is non-display area may be reduced.

In an exemplary embodiment, a length of the flexible film 120 and/or the connecting line CL is extended in the first direction D1 (horizontal in FIG. 4). Since a length of the flexible film 120 and/or the connecting line CL at the bent portions thereof are disposed in the thickness direction of the display apparatus instead of in the first direction D1, the length at the bent portion does not add to a planar dimension of the peripheral area PA in the top plan view. Since the planar dimension of the peripheral area PA is reduced by bending layers in the thickness direction, a width of the bezel (e.g., at the peripheral area) is decreased.

The first insulation layer 125 may be disposed on the flexible film 120. The first insulation layer 125 may reduce or effectively prevent diffusion of metal atoms and/or impurities from the flexible film 120 to other layers within the display panel. The wire grid polarizer WGP may be uniformly disposed or formed due to the first insulation layer 125. In addition, where the flexible film 120 may have a relatively irregular surface, the first insulation layer 125 may improve overall flatness of the surface of the flexible film 120. The first insulation layer 125 may include or be formed using a silicon compound. In an exemplary embodiment, for example, the first insulation layer 125 may include silicon oxide (SiOx), silicon nitride (SiNx), silicon oxynitride (SiOxNy), silicon oxycarbide (SiOxCy), silicon carbon nitride (SiCxNy), etc. These may be used alone or in a combination thereof.

The wire grid polarizer WGP may be disposed on the first insulation layer 125. The wire grid polarizer WGP may collectively include a protrusion (WGP in FIG. 4) provided in plurality which are disposed or formed at regular interval and have a same shape as each other. The wire grid polarizer WGP may have a pitch of about 50 nanometers (nm) to about 150 nm. The pitch is defined as a sum of a width of a single protrusion and a distance between protrusions adjacent to each other. Referring to FIG. 4, the width and distance may be taken in the first direction D1. The wire grid polarizer WGP may include a metal such as aluminum (Al), titanium (Ti), gold (Au), chromium (Cr), silver (Ag), copper (Cu), nickel (Ni), iron (Fe), cobalt Co), etc.

In some exemplary embodiments, the wire grid polarizer WGP may be a collective pattern which includes a plurality of layers disposed in the thickness direction. In an exemplary embodiment, for example, the wire grid polarizer WGP may include a first layer formed of aluminum, a second layer formed of titanium and disposed on the first layer, and a relatively hard mask layer including a silicon compound and disposed on the second layer.

The capping layer 130 may be disposed on the wire grid polarizer WGP. The capping layer 130 may include or be formed of inorganic insulation layer such as silicon oxide (SiOx), silicon nitride (SiNx), etc. In some exemplary embodiments, the capping layer 130 may cover the wire grid polarizer WGP to form an air gap between protrusions of the wire grid polarizer WGP adjacent to each other.

The gate pattern may be disposed on the capping layer 130. The gate pattern may include a metal material. The gate pattern may include a gate electrode GE and a signal line such as a gate line GL through which a signal is transmitted to drive a pixel in the display area DA. The gate line GL may define a length thereof which is larger than a width thereof and extends in the first direction D1. One or more of the aforementioned elements may be provided in plurality within the display area DA.

The second insulation layer 140 may be disposed on the capping layer 130 including the gate pattern thereon. The second insulation layer 140 may insulate the gate pattern from other layers of the display panel and include silicon oxide, metal oxide and the like.

In the display area DA, the active pattern ACT may be disposed on the second insulation layer 140 to overlap with the gate electrode GE. The active pattern ACT may include or define a source area thereof and a drain area thereof each of which is an impurity-doped area, and further include or define a channel area thereof between the source area and the drain area.

The data pattern may be disposed on the active pattern ACT. The data pattern may include a source electrode SE which is connected to the source area such as making contact with the source area and a drain electrode DE which is connected to the drain area such as making contact with the drain area. The data pattern may include a metal material. The data pattern may further include signal line such as a data line DL through which a signal is transmitted to drive a pixel in the display area DA. One or more of the aforementioned elements may be provided in plurality within the display area DA.

The data line DL may define a length thereof which is larger than a width thereof and extends in a second direction D2 which crosses the first direction D1 such as being perpendicular thereto. A third direction may cross each of the first and second directions D1 and D2, and define a thickness direction of the display apparatus and/or the display panel (e.g., vertical in the views of FIGS. 2 and 4).

The gate electrode GE, the active pattern ACT, the source electrode SE and the drain electrode DE may be included in and collectively define a single thin film transistor TFT along with insulating layers therebetween. The channel area of the active pattern ACT may define the channel of the thin film transistor TFT. One or more of the aforementioned elements may be provided in plurality within the display area DA.

The third insulation layer 150 may be disposed on the second insulation layer 140 including the data pattern thereon. The third insulation layer 150 may include an organic insulation material or inorganic insulation material.

The pixel electrode PE may be disposed on the third insulation layer 150. The pixel electrode PE may be provided in plurality within the display area DA. The pixel electrode PE may be electrically connected to the drain electrode DE of the thin film transistor TFT such as contact therewith at a contact hole CNT disposed or formed through the third insulation layer 150. The pixel electrode PE may include a transparent conductive material. In an exemplary embodiment, for example, the pixel electrode PE may include indium tin oxide ("ITO") or indium zinc oxide ("IZO"). The pixel electrode PE may be disposed in a pixel display area among areas of an individual pixel (e.g., area A) at which the image is displayed. The individual pixel may also include a pixel non-display area at which the image is not displayed. Elements such as the thin film transistor TFT, the gate pattern, the data pattern, etc. may be disposed in the pixel non-display area.

The display apparatus may further include the connecting line CL disposed in the peripheral area PA.

The connecting line CL may be disposed on the first insulation layer 125 on the flat portion of the flexible film and on the bent portion of the flexible film 120. A length of the connecting line CL may be bent along the side surface of the lower base substrate 110 similar to the bent portion of the flexible film 120 and the first insulation layer 125.

The connecting line CL in the peripheral area PA may be electrically connected to the thin film transistor TFT in the display area DA. More particularly, the connecting line CL may be extended from or an extension of the gate line GL or the data line DL which is electrically connected to the thin film transistor TFT. In an exemplary embodiment, for example, the connecting line CL may include or be formed of the same material as the gate pattern, such as in a same manufacturing process of a display apparatus. Thus, the connecting line CL and the gate pattern may be formed from a same material layer such as by a same manufacturing process at a same time as each other, to be disposed in a same layer of the display panel among layers disposed on the first base substrate 110.

In some exemplary embodiments, the connecting line CL may be formed of the same material layer as the data pattern, such as in a same manufacturing process of a display apparatus. Thus, the connecting line CL and the data pattern may be formed from a same material layer such as by a same manufacturing process at a same time as each other, to be disposed in a same layer of the display panel among layers disposed on the first base substrate 110.

The connecting line CL may be electrically connected to a driving part 500 which generates and/or provides a signal to the display area DA to generate and/or display an image. The connecting line CL may receive a gate signal and/or a data signal generated and/or provided from the driving part 500 and respectively transmit the gate and data signal to the gate line GL and the data line DL.

In the peripheral area PA, the second insulation layer 140 may function as a protecting layer to cover and protect the connecting line CL. A length or major surface of the connecting line CL may not be exposed to outside the display panel or the display apparatus due to the covering second insulation layer 140 and the driving part 500.

Although the protecting layer is the second insulation layer 140 in the exemplary embodiment, the invention is not limited thereto. The protecting layer in the peripheral area PA may be any layer which can cover and insulate the connecting line CL. In an exemplary embodiment, for example, the third insulation layer 150 disposed in the display are DA may be extended in to the peripheral area PA to be disposed or formed on the connecting line CL as the protecting layer in the peripheral area PA.

The upper substrate 200 may be disposed to face the lower substrate 100. The upper substrate 200 may include an upper base substrate 210, a color filter CF and a common electrode CE. One or more of the aforementioned elements may be provided in plurality within the display area DA.

The upper base substrate 210 may be disposed to face the lower base substrate 110. The upper base substrate 210 may include a material which has relatively high transmittance, thermal resistance and chemical resistance. In an exemplary embodiment, for example, the upper base substrate 210 may include a glass substrate, a quartz substrate, a transparent resin substrate, etc.

The color filter CF may be disposed on the upper base substrate 210. The color filter CF may provide a color to light passing through the liquid crystal layer 300 and incident to the color filter CF. The color filter CF may be a red color filter, a green color filter and a blue color filter, but the invention is not limited thereto. The color filter CF may be provided corresponding to each of a plurality of pixels disposed in the display area DA, and may be disposed to have different color corresponding to pixels adjacent each other. The color filter CF may be overlapped with or spaced apart from adjacent color filters at a boundary therebetween.

The common electrode CE may be disposed on the upper base substrate 210 including the color filter CF thereon. The common electrode CE may include a transparent conductive material. In an exemplary embodiment, for example, the common electrode CE may include indium tin oxide ("ITO"), indium zinc oxide ("IZO"), etc.

Although the color filter CF and the common electrode CE are included within the upper substrate 200, the invention is not limited thereto. In an exemplary embodiment, for example, the upper substrate 200 may further include a light blocking pattern. In some exemplary embodiments, the color filter CF may be included within the lower substrate 100 instead of within the upper substrate 200. In some exemplary embodiments, the common electrode CE is disposed or formed within the lower substrate 100 instead of the upper substrate 200, such that the display apparatus may have a structure to generate a horizontal electric field such as for an in-plane switching ("IPS") or fringe-field switching ("FFS") mode.

An optical medium layer such as the liquid crystal layer 300 may be disposed between the lower substrate 100 and the upper substrate 200. The liquid crystal layer 300 may include liquid crystal molecules having optical anisotropy. The liquid crystal molecules are driven by an electric field, so that an image is displayed by passing or blocking light from passing through the liquid crystal layer 300. The liquid crystal layer 300 may be sealed between the lower and upper substrates 100 and 200 by the sealing member 400 which is disposed between the lower substrate 100 and the upper substrate 200 in the peripheral area PA. While the sealing member 400 is shown at one outer edge area of the display panel by FIGS. 1 and 4, the sealing member 400 may be disposed at the outer edge area at all sides of the display panel in the top plan view.

FIGS. 5A to 5E are cross-sectional views illustrating an exemplary embodiment of a method of manufacturing the display apparatus of FIG. 1. The views are each taken along line I-I' of FIG. 1 and line II-II' of FIG. 3.

Figure 5A:
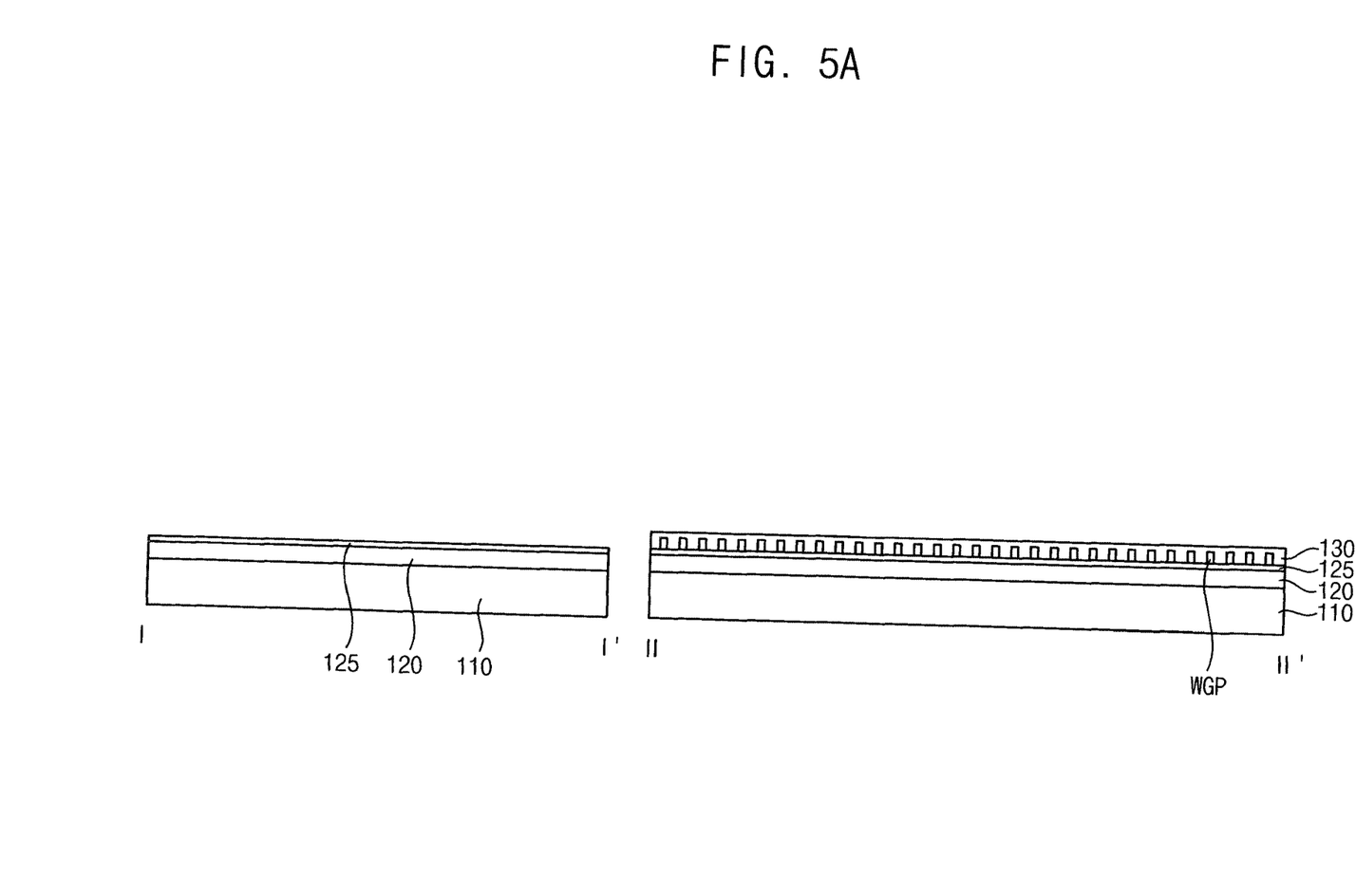
FIGS. 5A to 5E are cross-sectional views illustrating an exemplary embodiment of a method of manufacturing the display apparatus of FIG. 1.

Referring to FIG. 5A, a flexible film 120 may be formed on a lower base substrate 110. The flexible film 120 may be formed by coating above mentioned material on an upper surface of the lower base substrate 110. The upper surface of the lower base substrate 110 is disposed in what will be a display area and a peripheral area of a display panel and/or the display apparatus. Here, the flexible film 120 may have sufficient cross-sectional thickness to be extended further than an outer edge of the lower base substrate 110 and bent along a side surface thereof to be disposed at a lower surface of the lower base substrate 110 opposite to the upper surface thereof. In an exemplary embodiment, for example, the flexible film 120 may have a cross-sectional thickness of about 1 μm or more. The cross-sectional thickness of the flexible film 120 may be determined according to constituent material of the flexible film 120.

The flexible film 120 may be formed of a material having excellent heat resistance since the method may include a relatively high temperature process such as a laser beam irradiation process. In an exemplary embodiment, for example, the flexible film 120 may be formed of polyimide which has a heat resistance of greater than about 300 degrees Celsius.

A first insulation layer 125 may be formed on the flexible film 120. The first insulation layer 125 may be formed by a spin coating process, a chemical vapor deposition ("CVD") process, a plasma enhanced chemical vapor deposition ("PECVD") process, a high density plasma-chemical vapor deposition ("HDP-CVD") process, a printing process, etc. according to constituent material of first insulation layer 125.

The flexible film 120 is formed on an entirety of the lower base substrate 110 (e.g., commonly disposed at the display area and peripheral area), and then the first insulation layer 125 is formed on the commonly disposed flexible film 120, so that a stepped portion between a display area (refer to DA of FIG. 2) and a peripheral area (refer to PA of FIG. 2) are not formed. Thus, breakage of a connecting line CL which will be subsequently formed on the flexible film 120 may be reduced or effectively prevented.

A wire grid polarizer WGP as a collection of individual protrusions (refer to WGP in FIG. 5A) may be formed on the first insulation layer 125 in the display area DA. The wire grid polarizer WGP may be formed by an imprint lithography method, etc.

A capping layer 130 may be formed on the wire grid polarizer WGP. The capping layer 130 may be formed by a spin coating process, a CVD process, a PECVD process, a HDP-CVD process, a printing process, etc. according to constituent material of the capping layer 130

Figure 5B:
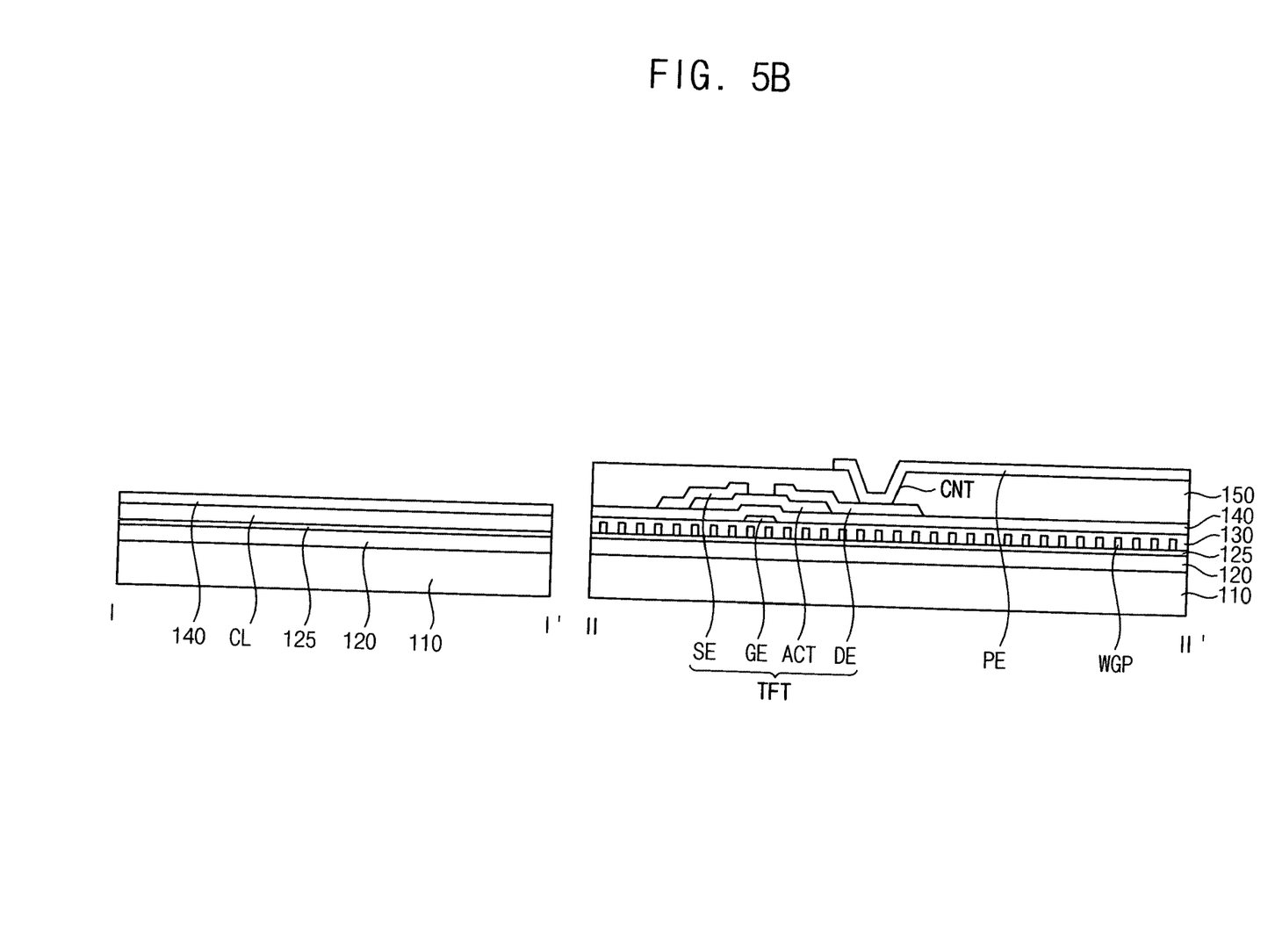

Referring to FIG. 5B, in the display area DA of the display panel and/or display apparatus to be manufactured, a gate pattern including a gate electrode GE and a gate line (refer to GL of FIG. 3), a second insulation layer 140, an active pattern ACT, a data pattern including a source electrode SE, a drain electrode DE and a data line (refer to DL of FIG. 3), a third insulation layer 150 and a pixel electrode PE may be sequentially formed on the capping layer 130.

A (first) conductive material layer (not illustrated) may be formed on the capping layer 130, and then the conductive material layer may be partially etched by a photolithography process or an etching process using an additional etching mask. Hence, the gate pattern may be provided on the capping layer 130. Here, the conductive material layer may be formed by a printing process, a sputtering process, a chemical vapor deposition process, a pulsed laser deposition ("PLD") process, a vacuum evaporation process, an atomic layer deposition ("ALD") process, etc.

The second insulation layer 140 may be formed on the capping layer 130 including the gate pattern thereon. The second insulation layer 140 may be obtained by a spin coating process, a sputtering process, a chemical vapor deposition process, a plasma enhanced chemical vapor deposition process, a high density plasma-chemical vapor deposition process, a printing process in accordance with constituent materials included in the second insulation layer 140.

An active material layer (not shown) may be formed on the second insulation layer 140, and then the active material layer may be patterned to form the active pattern ACT. The active material layer may include a semiconductor layer including amorphous silicon (a-Si:H) and an ohmic contact layer including n+ amorphous silicon (n+ a-Si:H). In addition, the active material layer may include an oxide semiconductor. The oxide semiconductor may include an amorphous oxide including at least one among indium (In), zinc (Zn), gallium (Ga), tin (Sn) and hafnium (Hf).

The data pattern may be formed on the second insulation layer 140 including the active pattern thereon. A (second) conductive material layer may be formed on the second insulation layer 140, and then the conductive layer may be partially etched by a photolithography process or an etching process using an additional etching mask. Hence, the data pattern may be provided on the second insulation layer 140. Here, the conductive layer may be formed by a printing process, a sputtering process, a chemical vapor deposition process, a pulsed laser deposition process, a vacuum evaporation process, an atomic layer deposition process, etc.

Although the data pattern is formed after formation of the active pattern in the exemplary embodiment, the invention is not limited thereto. The active pattern ACT and the data pattern may be formed at a same time and in a same process within the manufacturing method. In an exemplary embodiment, for example, the active material layer of the data pattern and the conductive material layer are sequentially formed, and then the conductive material layer of the data pattern and the active material layer may be simultaneously patterned to finally form a shape or profile of the active pattern ACT and the data pattern.

The third insulation layer 150 may be formed on the second insulation layer 140 including the data pattern thereon. The third insulation layer 150 may be obtained by a spin coating process, a sputtering process, a chemical vapor deposition process, a plasma enhanced chemical vapor deposition process, a high density plasma-chemical vapor deposition process, a printing process in accordance with constituent materials included in the third insulation layer 150.

A contact hole CNT extending through the third insulation layer 150 to expose the data pattern may be formed. The third insulation layer 150 may be partially etched by a photolithography process or an etching process using an additional etching mask to form the contact hole CNT. Hence, referring to FIG. 5B, the contact hole CNT which exposes the drain electrode DE of the thin film transistor TFT through the third insulation layer 150 may be formed.

The pixel electrode PE may be formed on the third insulation layer 150. A transparent conductive material layer (not shown) may be formed on the third insulation layer 150, and then the transparent conductive material layer may be partially etched by a photolithography process or an etching process using an additional etching mask. Hence, the pixel electrode PE may be provided on the third insulation layer 150. The transparent conductive material layer may be formed by a printing process, a sputtering process, a chemical vapor deposition process, a pulsed laser deposition process, an atomic layer deposition process, a vacuum evaporation process, pulsed laser deposition process, etc.

Here, a connecting line CL may be formed on the first insulation layer 125 in the peripheral area PA. The connecting line CL may be connected to a driving member or part which provides a driving or control signal to the display area, and may provide such signal to the display area from the driving member. The connecting line CL and the gate pattern may be formed from a same material layer by a same process at a same time to be disposed in a same layer of the display panel among layers disposed on the lower base substrate 110. In some exemplary embodiments, the connecting line CL and the data pattern may be formed from a same layer by a same process at a same time to be disposed in a same layer of the display panel among layers disposed on the lower base substrate 110. The connecting line CL may be provided in plurality within the display panel, with first connecting lines CL respectively extending from or being an extension of a plurality of gate lines GL and second connecting lines respectively extending from or being an extension of a plurality of data lines DL. FIG. 5B and FIG. 4 illustratively show one connecting line CL for convenience of explanation.

The second insulation layer 140 may be formed on the connecting line CL. The second insulation layer 140 may be formed on an entirety of the lower base substrate 110 (e.g., commonly disposed at the display area and peripheral area. The second insulation layer 140 may cover and protect the connecting line CL in the peripheral area PA. In some exemplary embodiments, alternative to the second insulation layer 140 as a protective layer, the third insulation layer 150 may be formed on the connecting line CL, and cover and protect the connecting line CL in the peripheral area PA. That is, similar to that shown in FIG. 5B for the second insulation layer 140, the third insulation layer 150 may be formed on an entirety of the lower base substrate 110 (e.g., commonly disposed at the display area and peripheral area.

Accordingly, a lower (display) substrate (refer to 100 in FIG. 4) which collectively includes the lower base substrate 110, the flexible film 120, the first insulation layer 125, the wire grid polarizer WGP, capping layer 130, the gate pattern, the connecting line CL, the second insulation layer 140, the active pattern ACT, the data pattern, the third insulation layer 150 and the pixel electrode PE may be provided.

Figure 5C:
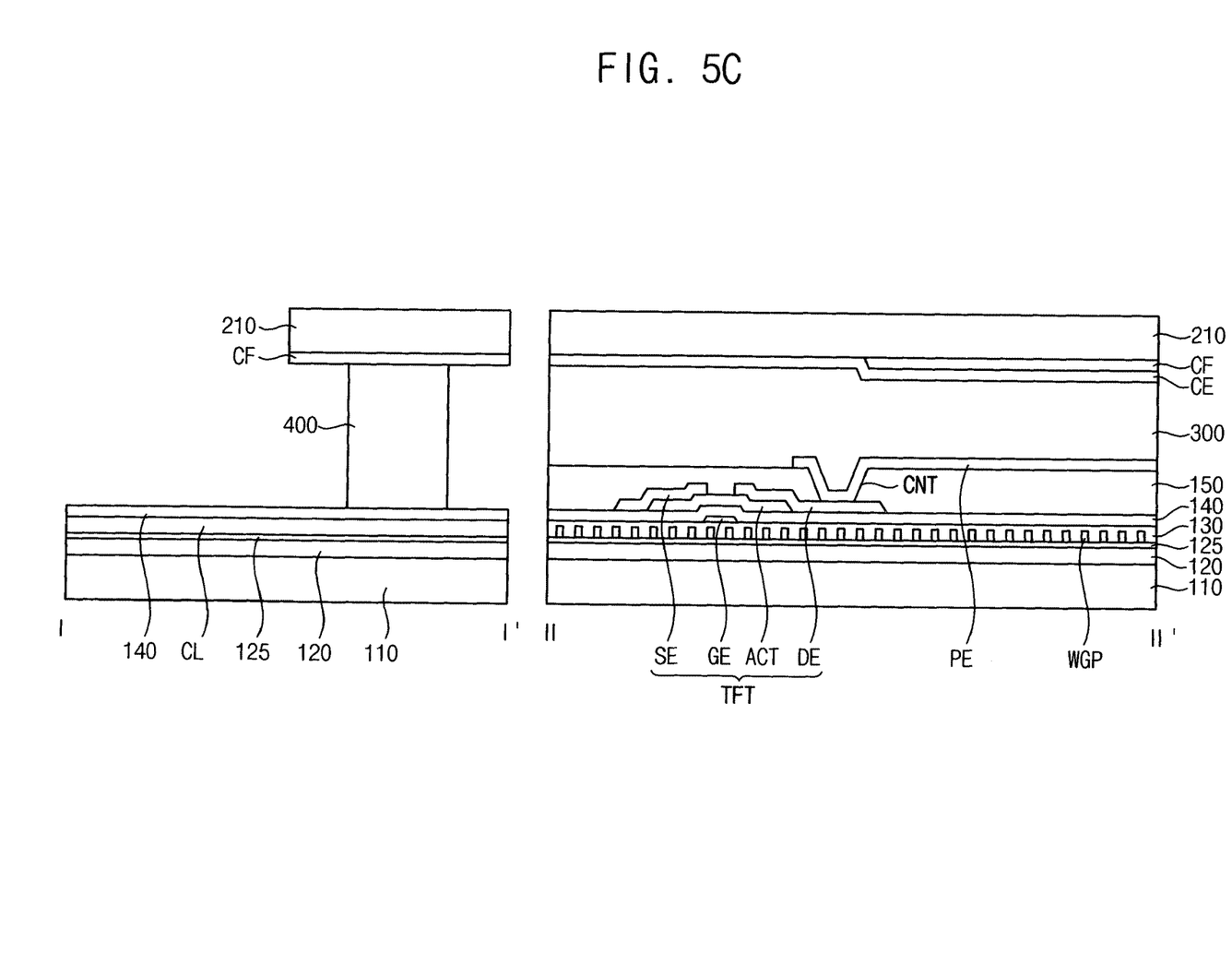

Referring to FIG. 5C, an upper (display) substrate (refer to 200 of FIG. 4) which includes a second base substrate 210, a color filter CF formed on the second base substrate 210 and a common electrode CE formed on the second base substrate 210 including the color filter CF thereon may be provided. Such upper substrate may be assembled separately from the lower substrate.

The upper substrate and the lower substrate may be combined to each other by a sealing member 400. An optical medium layer 300 such as a liquid crystal layer 300 may be formed by injecting an optical medium material layer such as liquid crystal material between the upper substrate and the lower substrate.

Figure 5D:
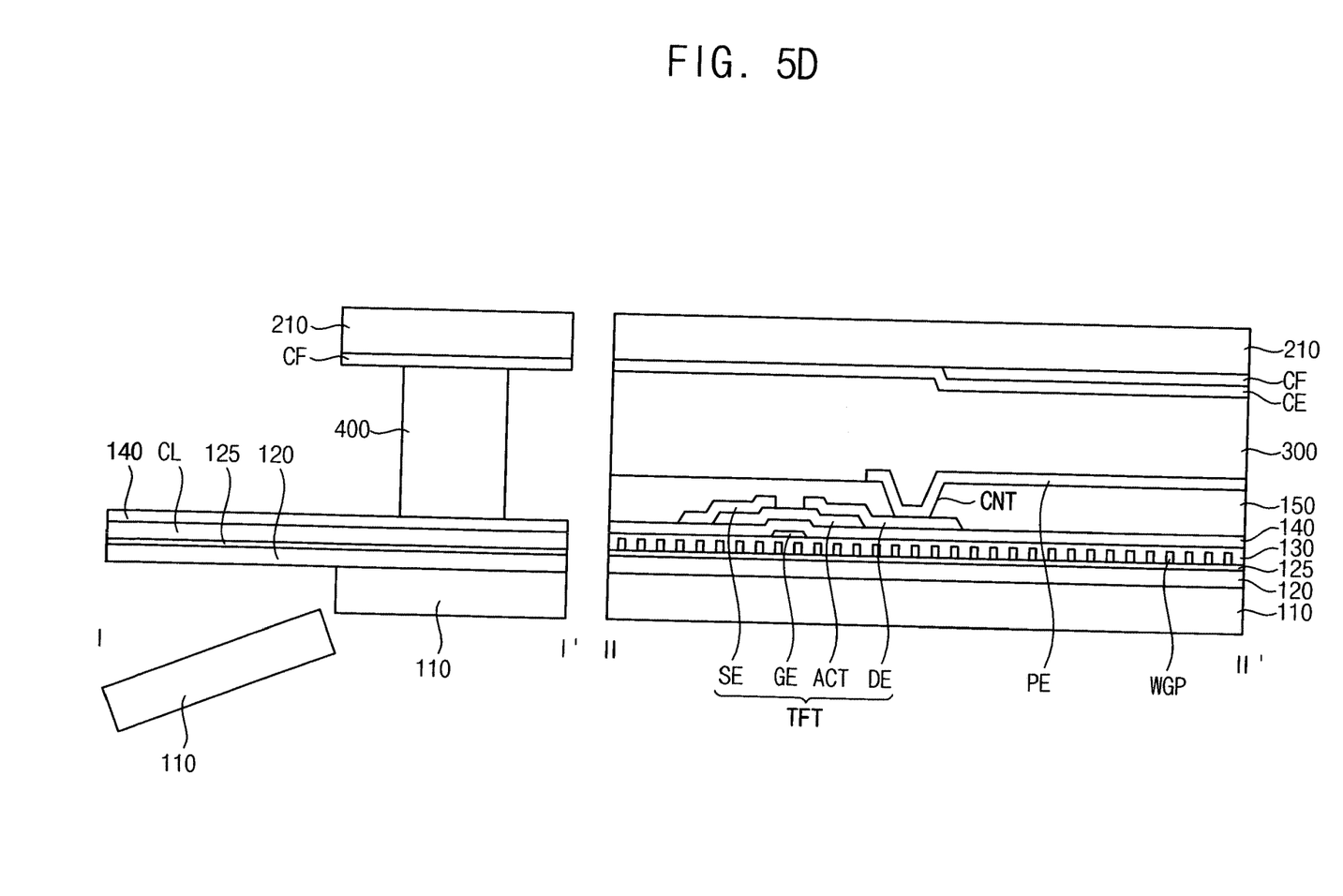

Referring to FIG. 5D, a portion of the lower base substrate 110 may be removed to expose a portion of the stacked layer of the flexible film 120, the first insulation layer 125, the connecting line CL and the second insulation layer 140. In an exemplary embodiment, a laser beam may be irradiated to a portion of the flexible film 120 in the peripheral area PA such as by being transmitted through a portion of the lower base substrate 110. The portion of the flexible film 120 at which the laser beam is irradiated corresponds to what will become a bent portion of the flexible film 120. A combining force of the bent portion of the flexible film 120 and the lower base substrate 110 may be weakened due to irradiation of the laser beam. A portion of the lower base substrate 110 corresponding to the bent portion of the flexible film 120 at which the combining force is weakened, may be cut and separated from the bent portion such as by using a laser or cutting device.

The removing of the portion of the lower base substrate 110 exposes a lower surface of the stacked layer of the flexible film 120, the first insulation layer 125, the connecting line CL and the second insulation layer 140, where the flexible film 120 defines such exposed lower surface. Also, removing of the portion of the lower base substrate 110 exposes a side surface of the remaining portion of the lower base substrate 110. Lengths of the exposed stacked layer may extend further than the side surface of the remaining portion of the lower base substrate 110. The extended stacked layer may disposed in a same plane as those layers on the remaining portion of the lower base substrate 110, such as a plane defined by the first and second directions D1 and D2. As being in the same plane, the extended stacked layer may be in a flat state thereof.

Figure 5E:
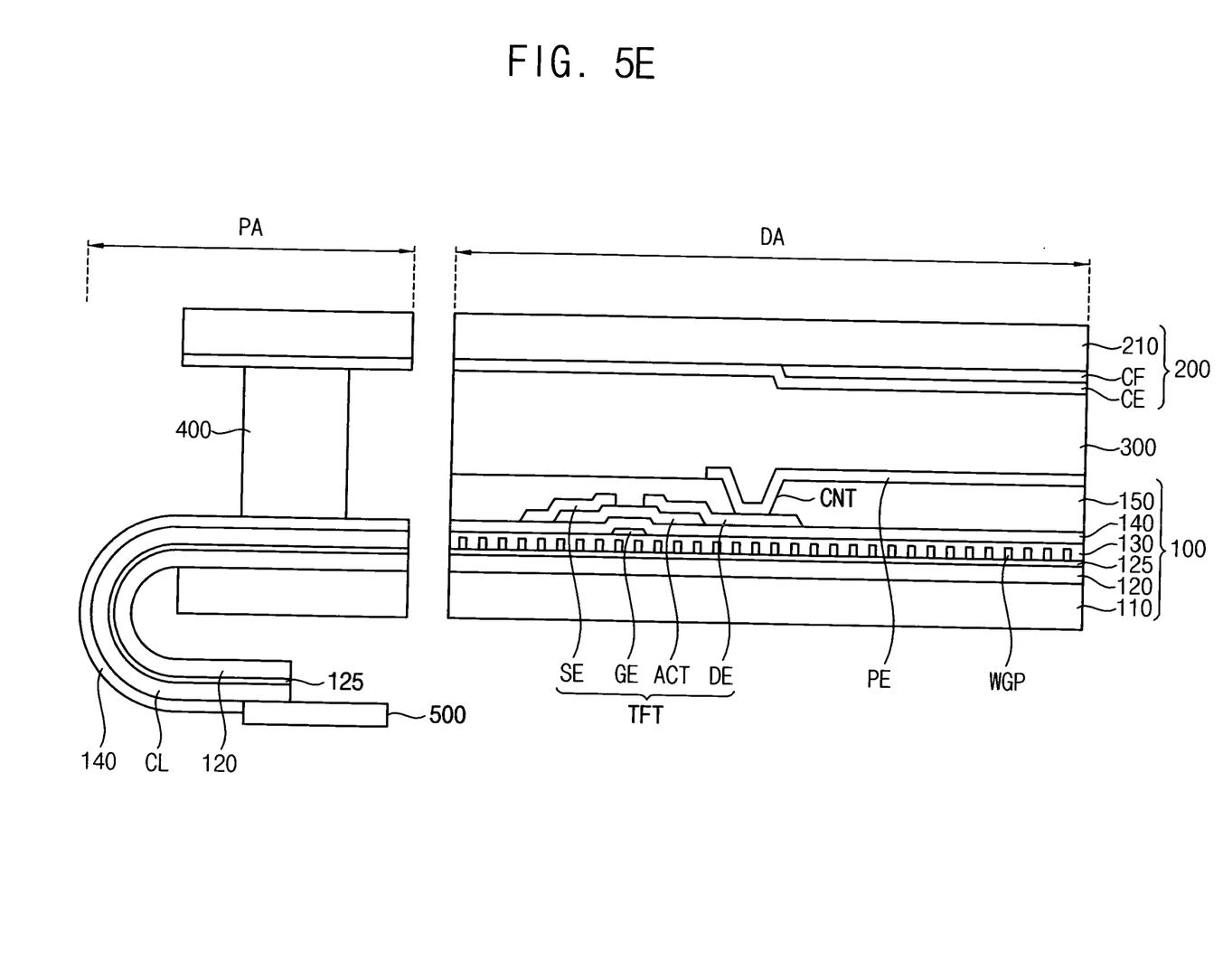

Referring to FIG. 5E, in the peripheral area PA, from the flat state thereof, the extended portions of the flexible film 120, the first insulation layer 125 on the flexible film 120, the connecting line CL on the first insulation layer 125, and the second insulation layer 140 on the connecting line CL may be bent along the side surface of the remaining portion of the lower base substrate 110. Distal ends of the bent portions of the stacked layer may be disposed below the remaining portion of the lower base substrate 110.

A portion of the second insulation layer 140 such as at the distal end thereof may be removed to expose a portion of the connecting line CL. An external member such as a driving part 500 generating and/or providing signals for controlling and driving the display apparatus may be electrically connected to the connecting line CL through the exposed portion thereof.

According to one or more exemplary embodiment of the invention, a display apparatus includes a flexible film including a flat portion and a bent portion which is bent along a side surface of a lower base substrate, and a wire grid polarizer disposed between an optical medium layer such as a liquid crystal layer and the flexible film. The flat portion of the flexible film is disposed on the lower base substrate in both a display area and in a peripheral area and extends from the peripheral area to be outside of the lower base substrate. The bent portion of the flexible film and the connecting line are both extensions of flat portions thereof located at the peripheral area and are bent along the side surface of the lower base substrate in the peripheral area. Accordingly, since lengths of layers such as the flexible film and connecting line area disposed in a thickness direction of the display apparatus, the lengths do not add to a planar dimension of the peripheral area. Since the planar dimension of the peripheral area is reduced, a size of the bezel such as a width thereof as a non-display area of the display apparatus may be reduced.

In addition, within a display panel of the display apparatus, the flexible film may have sufficient cross-sectional thickness in a flat state thereof so as to not be damaged even though the flexible film is bent. Here, the wire grid polarizer is disposed between the flexible film and the optical medium layer, so that light from a light source disposed outside the display panel may be polarized by passing the wire grid polarizer after passing through the flexible film. Thus, distortion of a displayed image due to retardation can be minimized.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus, comprising:
   a lower base substrate comprising:
      a display area at which an image is displayed; and
      a peripheral area adjacent to the display area and at which the image is not displayed;
   a thin film transistor and a wire grid polarizer each disposed on the lower base substrate in the display area thereof;
   a connecting line disposed on the lower base substrate in the peripheral area thereof, the connecting line electrically connected to the thin film transistor in the display area; and
   a flexible film disposed on the lower base substrate, the flexible film comprising a flat portion
   thereof in the display area and in the peripheral area,
   wherein in the peripheral area,
      the flat portion of the flexible film is disposed between the lower base substrate and the connecting line, and
      the flat portion which is disposed between the lower base substrate extends further than an end surface of the lower base substrate, to define a bent portion of the flexible film in the peripheral area.

2. The display apparatus of claim 1, wherein the flexible film comprises at least one among polyimide, polyethylene terephthalate, polycarbonate, polyethylene naphthalate and polyacrylate.

3. The display apparatus of claim 2, wherein the flexible film has a thickness greater than or equal to about 1 micrometer.

4. The display apparatus of claim 3, further comprising a first insulation layer disposed between the flexible film and the thin film transistor, the first insulation layer comprising an inorganic insulation material.

5. The display apparatus of claim 1, further comprising:
   a gate pattern disposed on the flat portion of the flexible film in the display area; and
   a data pattern disposed on the gate pattern in the display area;
   wherein the connecting line in the peripheral area is formed from a same material layer as the gate pattern or the data pattern in the display area.

6. The display apparatus of claim 5, further comprising in the peripheral area, a protecting layer disposed on the lower base substrate,
   wherein in the peripheral area, the connecting line is disposed between the lower base substrate and the protecting layer.

7. The display apparatus of claim 6, further comprising:
   a second insulation layer disposed between the gate pattern and the data pattern in the display area; and
   a third insulation layer disposed on the data pattern in the display area,
   wherein the protecting layer in the peripheral area is formed from a same material layer as the second insulation layer or the third insulation layer in the display area.

8. The display apparatus of claim 1, wherein the wire grid polarizer has a pitch of about 50 nanometers to about 150 nanometers.

9. The display apparatus of claim 8, further comprising a capping layer on the wire grid polarizer in the display area.

10. The display apparatus of claim 1, further comprising a driving part which generates and provides signals for driving the display area, the driving part disposed at a distal end of the bent portion of the flexible film in the peripheral area and electrically connected to the connecting line in the peripheral area.

11. A method of manufacturing a display apparatus, the method comprising:
   providing a lower base substrate comprising a display area at which an image is displayed and a peripheral area which is adjacent to the display area and at which the image is not displayed;
   providing a thin film transistor and a wire grid polarizer each on the lower base substrate in the display area thereof;
   providing a connecting line on the lower base substrate in the peripheral area thereof and electrically connected to the thin film transistor in the display area;
   providing a flexible film on the lower base substrate, the flexible film comprising a flat portion in the display area and in the peripheral area;
   in the peripheral area, separating a portion of the lower base substrate from a remainder of the lower base substrate to expose an end surface of the remainder of the lower base substrate,
   wherein in the peripheral area, each of the connecting line and the flat portion of the flexible film extends further than the end surface of the remainder of the lower base substrate; and
   in the peripheral area, bending each of the connecting line and the flat portion which extend further than the exposed end surface of the remainder of the lower base substrate, along the exposed end surface of the remainder of the lower base substrate to form the display apparatus.

12. The method of claim 11, wherein the separating of the portion of the lower base substrate comprises irradiating a laser beam to the flat portion of the flexible film in the peripheral area and removing the portion of the lower base substrate from the remainder of the lower base substrate.

13. The method of claim 11, wherein the providing of the flexible film comprises coating at least one among polyimide, polyethylene terephthalate, polycarbonate, polyethylene naphthalate and polyacrylate on the lower base substrate.

14. The method of claim 11, wherein the flexible film has a thickness of greater than or equal to about 1 micrometer.

15. The method of claim 11, further comprising providing a first insulation layer on the flexible film in the display area before the providing of the wire grid polarizer, the first insulation layer comprising an inorganic insulation layer.

16. The method of claim 11, further comprising:
providing a gate pattern on the flexible film in the display area; and
providing a data pattern on the gate pattern in the display area,
wherein the connecting line in the peripheral area is formed from a same material layer as the gate pattern or the data pattern in the display area.

17. The method of claim 16, further comprising providing a protecting layer on the connecting line in the peripheral area.

18. The method of claim 17, further comprising:
providing a second insulation layer on the gate pattern in the display area; and
providing a third insulation layer on the data pattern in the display area,
wherein the protecting layer in the peripheral area is formed from a same material layer as the second insulation layer or the third insulation layer in the display area.

19. The method of claim 11, wherein the wire grid polarizer has a pitch of about 50 nanometers to about 150 nanometers.

20. The method of claim 19, further comprising providing a capping layer on the wire grid polarizer in the display area.

* * * * *